United States Patent [19]

Lammers et al.

[11] Patent Number: 5,513,267

[45] Date of Patent: Apr. 30, 1996

[54] SIGNAL STRENGTH ADAPTER CIRCUIT

[75] Inventors: Franciscus W. M. Lammers, Hasselt, Belgium; Bart J. S. De Loore, Eindhoven, Netherlands

[73] Assignee: U.S. Philips Corporation, New York, N.Y.

[21] Appl. No.: 153,388

[22] Filed: Nov. 16, 1993

[30] Foreign Application Priority Data

Nov. 17, 1992 [EP] European Pat. Off. ............. 92203518

[51] Int. Cl.$^6$ ....................................................... H03G 3/00
[52] U.S. Cl. ............................................ 381/104; 381/109
[58] Field of Search ................................... 381/104, 109, 381/119

[56] References Cited

U.S. PATENT DOCUMENTS 4,306,114  12/1981  Callahan ...................................... 179/1
4,409,682  10/1983  Mori et al. ................................. 381/104
5,146,504   9/1992  Pinckley ..................................... 381/104
5,150,415   9/1992  Jaffee et al. ............................... 381/104
5,313,523   5/1994  Kawauchi ................................... 381/104

*Primary Examiner*—Stephen Brinich
*Attorney, Agent, or Firm*—Edward W. Goodman

[57] ABSTRACT

The disclosed signal strength adapter circuit includes a signal adapter (20) having a signal input (21) for receiving a signal whose strength is to be adapted, a digital set input (22) for receiving a strength value, and a signal output (23) for producing an adapted signal whose strength corresponds to the strength value on the set input (23). At successive discrete instants, a generator (24) generates a series of function values which determine an exponential time function (30) in coarse steps. The circuit includes an adapter circuit (26, 27) for adapting the signal strength in fine steps in the time intervals between the instants at which the function values are generated.

11 Claims, 3 Drawing Sheets

SIGNAL STRENGTH ADAPTER CIRCUIT

BACKGROUND OF THE INVENTION

1. Field of the Invention

The invention relates to a signal strength adapter circuit for smoothly changing a signal strength starting with an initial signal strength and ending with a final signal strength, the circuit comprising a signal adapter having a signal input for receiving the signal, a digital set input for receiving a strength value, and a signal output for presenting an adapted signal that has a strength corresponding to the strength value on the set input, and the circuit further including control means for generating, at successive discrete instants, a series of strength values which fix a function changing with time and including means for applying the generated strength values to the set input.

2. Description of the Related Art

A circuit of said type which is also denoted as of fade-in and fade-out circuit, is known, for example, from U.S. Pat. No. 4,306,114.

In the circuit described in that document, the signal strength of an audio signal is adapted in fading steps. The step size in absolute sense is the same for each adaptation, so that the variation with time of the signal strength presents an approximately linear pattern. Such a linear variation of the strength is sensed as not being smooth by the listener. In addition, the steps are selected to be rather large which is experienced by most listeners as annoying. Finally, the possibilities to set the speed with which an adaptation is carried out and the extent of the adaptation are limited.

SUMMARY OF THE INVENTION

It is an object of the invention to provide a circuit in which a change of signal strength is obtained which is experienced by the listener as a smooth and less annoying change and by which it is possible to set the speed with which an adaptation is carded out and the extent of the adaptation in sufficiently small steps and without many computations.

This object is achieved by a circuit as defined in the opening paragraph, characterized in that the control means comprise function generator means for periodically generating a next function value of a series of successive function values which determine, in coarse steps, a function in essence exponentially changing with time, and adapter means for adapting the strength value in fine steps in accordance with a predetermined variation starting with a function value that has just been given and ending with a function value that is given next.

In the circuit according to the invention, the signal strength variation is controlled exponentially, which is sensed by the listener as a very constant change of strength. The speed with which the volume is adapted may be set highly accurately by adapting the length of the intervals at which the function values are supplied. This means that the calculation of the function values need not be adapted when the setting of the adaptation speed is changed. Only the instants at which these function values are to be generated need to be adapted. By using coarse steps, also the number of operations to determine the function values remains small. Small fading steps are desired to obtain an equal and less annoying adaptation. This is achieved by changing the signal strength between the function values in small steps.

The fine-step adaptation of the signal strength is preferably linear because it is simple to realize. However, other adaptations are also possible. It is then advantageous for the small-step adaptation to be carried out in the same pattern. Always the same method of adaptation may then be used for adapting successively generated function values.

An embodiment for the circuit in which a linear variation of the intermediate values is achieved in a simple manner is characterized in that the successive signal values at the input of the signal adapter are presented in synchronism with a specific clock signal, while the fine steps correspond to the least significant bit in the strength value, and the circuit comprises means for terminating the adaptation once the strength value has reached the level of the generated function value.

In this embodiment, the signal strength with a given word length for the strength value varies with the smallest possible steps.

The function values expressing the exponential variation of the strength may be stored in a memory, for example, a ROM. Due to the relatively large steps in the approximation of the exponential variation, the size of the memory may remain small.

If a digital multiplier is used for the signal adapter, this multiplier may also be used for determining the function values.

An embodiment for the signal strength adapter circuit in which this is realized is characterized, in that function generator means comprise control means for causing the digital multiplier to perform an iterated multiplication for which the result of a previous multiplication is multiplied each time by a constant value and successive results obtained therefrom represent the successive function values.

When a digital multiplier is used, the number of bits effectively used for the signal values on the output is very small with a low signal strength. This may lead to undesired distortions in the event of very low signal strength.

An embodiment for the circuit eliminating this drawback is characterized in that the multiplier is arranged for generating an m-bit signal value, the circuit comprising noise shaping means for achieving an accurate handling of the signal processed by the multiplier, the noise shaping means comprising quantizing means for presenting n most significant bits of the m-bit signal value on the signal output, and adder means for adding the m-n least significant bits of the m-bit signal value to a next m-bit signal value to be generated by the multiplier.

In this embodiment the effect of truncating errors made during the multiplication and, consequently, the disturbance of the adapted signal is reduced considerably.

BRIEF DESCRIPTION OF THE DRAWINGS

The invention will be further explained hereinafter with reference to a drawings in which.

DESCRIPTION OF THE PREFERRED EMBODIMENT

With the reproduction of audio information there is often a need for changing the strength of the reproduced audio signal from an initial value to a final value in a manner smooth to the hearing system. Such a smooth change of signal strength is often denoted by the terms of fade-in and fade-out. Preferably, the signal strength varies as an exponential function of time, because such a variation is perceived as being very smooth by a listener.

Figure 3:
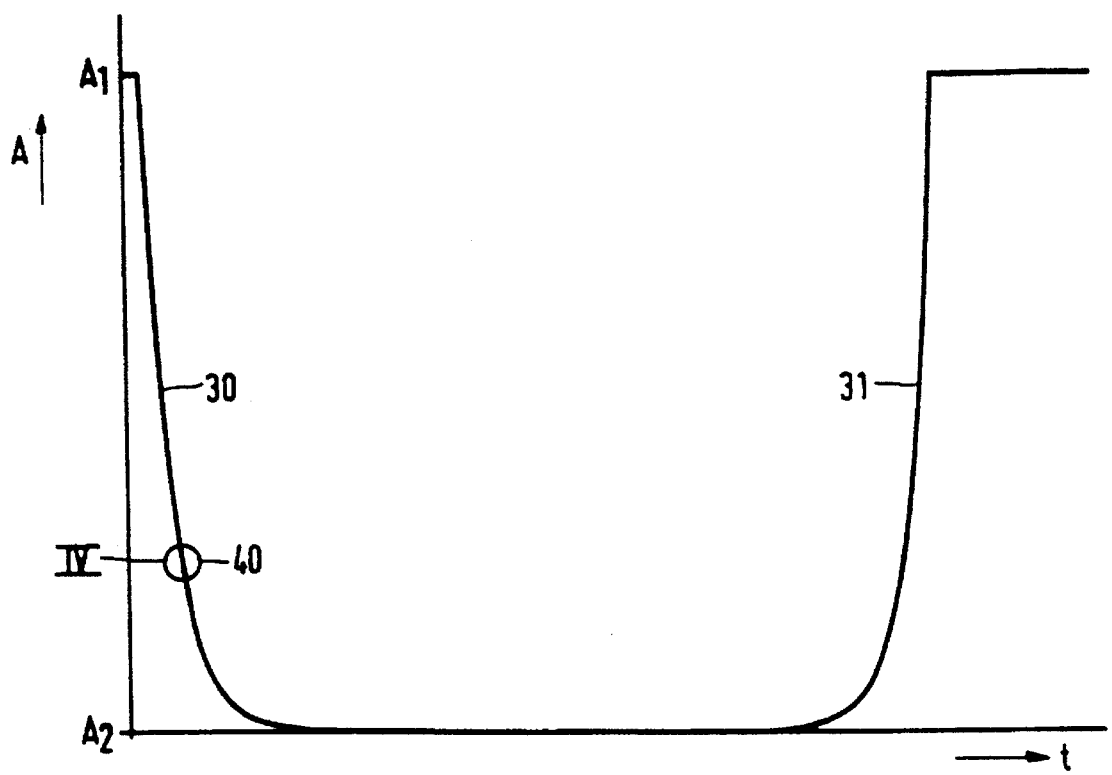
FIGS. 3 and 4 show, by way of illustration, the variation of the signal strength plotted against time.

FIG. 3 shows such an exponential variation. The curve 30 shows a variation in which the function value A decreases exponentially as a function of time beginning with the initial value A1 and ending with a final value A2. The curve 31 shows an exponential increase of the function value plotted against time t.

In discrete-time systems, which the customary digital signal processors are, such a variation of the signal strength may only be approximated by setting the signal strength at discrete instants to strengths corresponding to the function values of the exponential function at these instants. The step size denoting the difference between two successive function values then has to be small to avoid the listener perceiving a clear step-like change of signal strength. A practical value for the step size lies, for example, in the order of 0.1 dB. With a customary change of signal strength of, for example, about 96 dB, this means that the number of function values to be generated is of the order of 960.

If these function values were used directly for setting the signal strength, this would result in an audible distortion of the strength-modified audio signal as will be explained hereinafter. Let us assume that in a time interval of a customary length of two seconds, the signal strength is controlled from initial value to final value, this means approximately 500 step-size adaptations of 0.1 dB per second. Such a change may be considered a completely smooth (non-stepped) change of signal strength with, superposed thereon, an amplitude modulation with a signal strength of 0.1 dB and a frequency of about 500 Hz. This results in a noise component lying in the audible frequency range. This noise may be reduced by changing the signal strength between two function values in smaller steps. This could be effected by selecting an even smaller step size in lieu of a 0.1 dB step size when the function values are generated. Smaller steps, however, are detrimental as will be further explained hereinafter with reference to an example.

Let us assume that the desired variation (V) of the signal strength is given by $A^t$, that the signal strength is adapted with each new sample value of the audio signal, that the maximum fade duration is about 23 seconds to reduce the signal strength by a factor of $2^{16}$. With a sample rate of 44.1 kHz this means that the number of steps in which the signal strength is changed is equal to 1,014,300. The associated value of A is equal to 0.999989 ($\approx 1-2^{-16}$). The fade rate may be set by adapting A. The next A value is equal to $1-2^{-15}$. With this value of A, the signal strength is reduced to $2^{-16}$ in 363,400 steps. This means that the next fade duration may be set at about one third of the maximum fade duration. In addition, for each newly desired fade duration, a new value of A is to be calculated, based on the desired fade duration in the desired signal strength change, which is a complicated calculation and thus requires an advanced arithmetic circuit.

Figure 4:
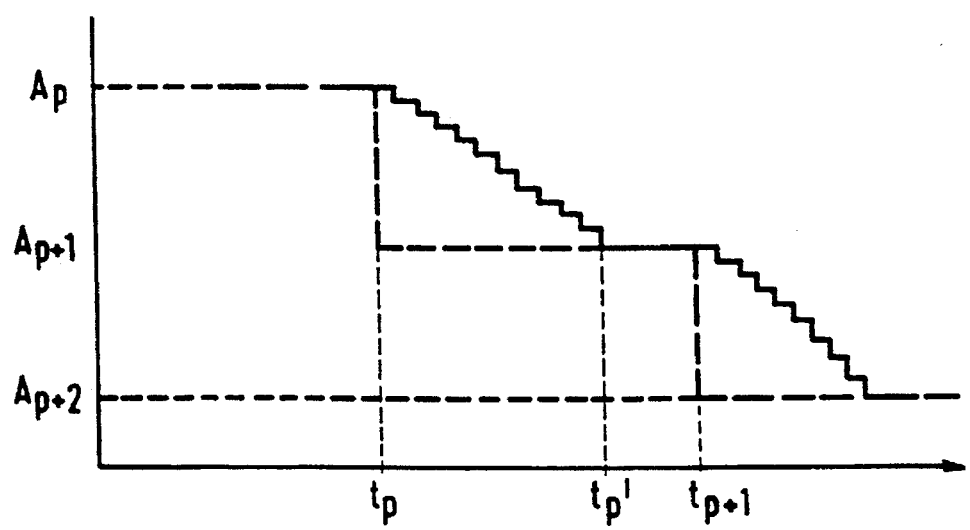

Preferably, the exponential function is to be approximated in coarse steps of, for example, 0.1 dB, and the strength value between two successive function values is reduced in accordance with a specific variation with time as is shown, for example, in FIG. 4, which shows an enlarged form of an approximation of a small portion 40 of the variation shown in FIG. 3. The successive function values at the instants tp and tp+1 are equal to $A_p$ and $A_{p+1}$. From instant tp, the strength value diminishes in small steps from $A_p$ to $A_{p+1}$. Though not of necessity, the size of these small steps preferably corresponds to the least significant bit of the strength value, since they are the smallest steps that can be made with a given word length (bits) for the strength value. The adjustments in the time interval between the instants $t_p$ and $t_{p+1}$ show a linear variation. This is advantageous because such a variation is very easy to realize. However, there should be observed that the variation may also be different from linear in principle. It is essential that the step size is sufficiently small not to cause any audible distortion. In addition, it is advantageous for the strength value variation between successive function values smoothly changes from $A_p$ to $A_{p+1}$. The variation is preferably always the same so that this variation may be realized with simple technical means.

The method described above is advantageous in that the fade duration (this is the total duration of the fade procedure) and the fade step can be set accurately and in a simple manner, as will be illustrated hereinafter with the aid of an example.

Let us assume that the ratio between the minimum and maximum signal strengths is $2^{16}$ ($\approx 90$ dB) and that the signal strength can be set in $2^{10}$ steps. This means that the signal strength can be set with an accuracy of about 0.08 dB. The successive function values of the exponential variation desired for the fade-in and fade-out correspond to an accuracy (of 0.08 dB) with which the signal strength can be set.

The fade duration may be set by setting the intervals at which the function values are generated. Preferably, the length of these intervals is an integer number of times the period of the frequency with which the sample values of the signal whose signal strength is to be adapted are produced (for audio signals, a customary value of this frequency is equal to 44.1 kHz). A change of the length of the intervals by one period of this frequency corresponds to the $2^{10}$ $(44,100)^{-1} = 0.023$ second. Based on the desired fade step, the number of coarse steps in which the function value is to be adapted may be simply determined by dividing the fade step by the difference value of 0.08 dB between successive function values. Given this number of steps and a desired fade duration, the duration of the intervals between the generation of the successive function values can be determined by dividing the fade duration by said number of steps. The number of steps may be determined in a customary fashion by a program-controlled arithmetic circuit based on a fade duration and fade step fed by the user.

In the following there will be described an embodiment for the signal strength adapter circuit to be used in combination with a digitized audio signal.

Figure 1:
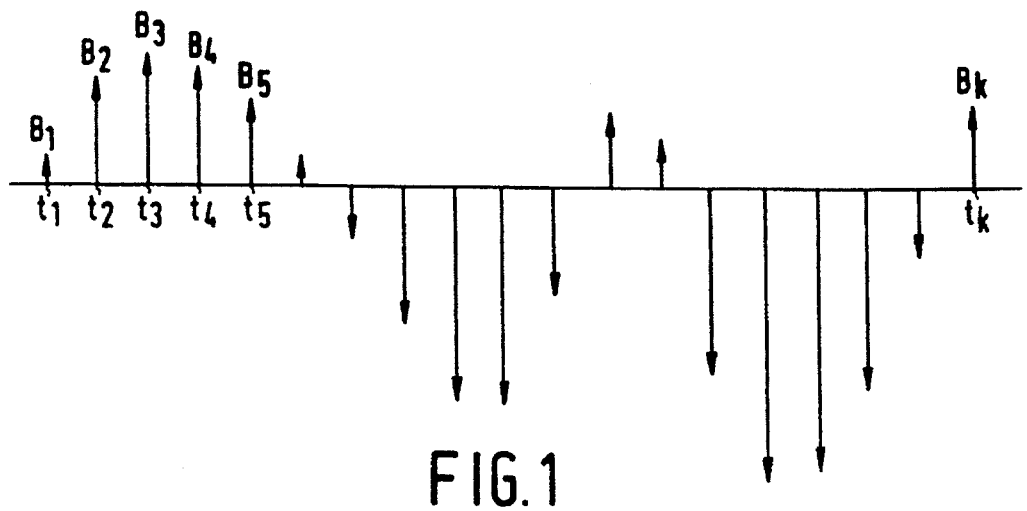
FIG. 1 represents a digitized signal.

FIG. 1 shows such a digitized signal. The signal shown comprises a number of signal samples B1, B2, B3, ..., Bk denoting the signal values of the audio signal at equidistant discrete instants t1, t2, t3, ..., tk. The signal values are represented by a digital word having a fixed word length of, for example, 16 bits.

Figure 2:
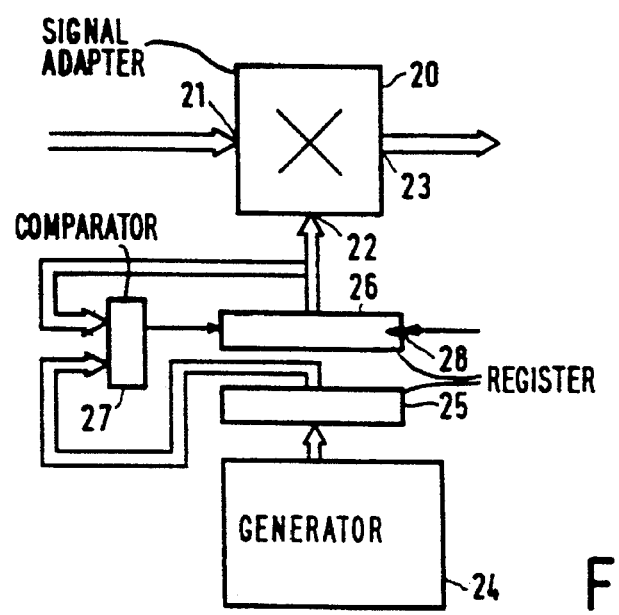
FIG. 2 shows an embodiment for the circuit according to the invention.

FIG. 2 shows a signal strength adapter circuit according to the invention. In this FIG. 2, a signal adapter is referenced 20. The signal adapter 20 has a signal input 21 for receiving a signal whose strength is to be adapted, for example, the audio signal represented in FIG. 1. The signal adapter 20 further has a set input 22 for receiving a strength value denoting the desired signal strength. Finally, the signal adapter 20 has a signal output 23. The signal adapter 20 is an adapter of a customary type generating on the output 23 a signal that corresponds to the signal received on the input 21, whose signal strength corresponds to the strength value presented at the set input 22. The signal adapter 20 preferably comprises a digital multiplier of a known type. There should be observed that also different signal adapters are possible. For example, in the case where the signal on signal input 21 is an analog signal, the signal adapter may be formed by an amplifier whose gain factor can be set in that a suitable digital setting signal is fed, as has been described, for example, in said U.S. Pat. No. 4,306,114.

The circuit shown in FIG. 2 further includes a generator 24 which generates a series of successive function values which denote the function values for the exponential function changing with time at discrete, preferably equidistant, instants. A new function value can, for example, be generated each time after a number of samples B that can be set (for example, fifteen) have been applied to the signal input 21.

The generated function value is stored in a register 25. The signal strength adapter circuit further includes a register 26 of a type whose contents may each time be changed by a constant adapting value in response to a clock pulse received through a clock input 28.

The clock pulse rate may be selected to be equal to the sample rate of the signal at the signal input 21. However, in principle a rate not related to the sampling rate may also be selected.

The adapting value preferably corresponds to the value of the least significant bit of the digital value stored in the register 26. For such an adapting value the strength value with a given word length (bits) is adapted in steps which are the finest possible. The contents of register 26 are compared with those of register 25 by a comparator circuit 27. A control signal denoting the result of this comparison is applied to a control input of the register 26. If this control signal denotes that the contents of the two registers are equal, the adaptation of the contents of the register 26 is interrupted in response to the supplied clock signals. The contents of the register 26 are continuously applied to the set input 22 of the signal adapter 20 as a strength value.

The operation of the circuit shown in FIG. 2 is as follows: let us assume that the set signal strength determined by the contents of register 26 is equal to A1 and that the signal strength is to be smoothly reduced to the final value A2.

In that case the generator 24 will be activated and will apply each time a new function value to the register 25 at equidistant instants. Once a new function value has been generated, which is lower than the strength value stored in the register 26, the comparator circuit 27 will generate a control signal as a result of which the contents of the register 25 will be adapted in response to a clock pulse. Consequently, the strength value variation obtains the downward shape shown in FIG. 4. At a specific instant referenced tp' in FIG. 4 the contents of the register 26 will again be equal to those of register 25 and, under the control of the control signal supplied by circuit 27, the clock pulse-driven adaptation of the strength value will be interrupted until the instant tp+1 at which a next function value is supplied by the generator 24. This process of adapting the function value in coarse steps and, subsequently, adapting the strength value in small steps is continued until the instant at which the strength value has reached the final value.

In like manner to the one described hereinbefore, the signal strength may also be smoothly increased. In that case the generator will generate function values of, for example, the curve 31 of FIG. 3 at equidistant instants. In response to the clock pulses received through input 28, the contents of the register 26 will constantly be increased with a small step until the contents of the register correspond to those of register 25. The adaptation in small steps is then interrupted again until the instant at which a next function value will be stored in the register 25 by the generator 24.

Figure 5:
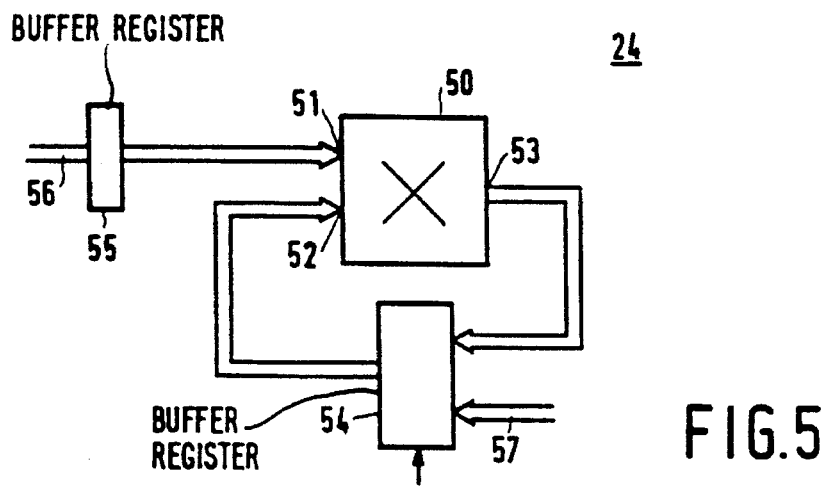
FIG. 5 shows an embodiment for a generator for generating function values of an exponential function.

The function generator 24 may comprise, for example, a ROM in which the series of function values are stored and a next function value is read from ROM at equidistant instants. The principle of another embodiment for the generator 24 is shown in FIG. 5. The generator shown 24 comprises a digital multiplier 50 having a first input 51 and a second input 52 and an output 53. The output 53 is coupled to an input of a buffer register 54. The output of the buffer register 54 is connected to the input 52 of the multiplier 50. Furthermore, the generator 24 includes a buffer register 55 whose output is connected to the input 51 of the multiplier 50. The buffer register 55 may contain a multiplication constant supplied over a bus 56. The buffer register 54 may contain an initial value supplied over a bus 57. The operation of the generator 24 shown in FIG. 5 is as follows:

Let us assume that a user enters the value of the desired fade step and desired fade duration via customary setting circuits, an arithmetic circuit, for example, comprised of generator 24, calculates the number of function values to be generated and the intervals in which these function values are to be generated in a manner described hereinbefore. Then the multiplication constant At (which is the same for any desired setting of fade duration and fade step) is loaded into the register 54 over bus 57. In addition, the initial value A1 is loaded into the buffer register 55 over bus 56. Subsequently, the contents of the register 55 are multiplied by the multiplier 50 and the result of the multiplication is again loaded into the register 54. In this manner the function values of the desired function are generated for successive equidistant time instants, until the desired number of function values has been generated and the signal strength has been adapted with the step size determined by the fade step. In the case where a multiplier is used both for the generation of the function value and for the signal adaptation, it is to be preferred to use the same multiplier for both functions.

Figure 6:
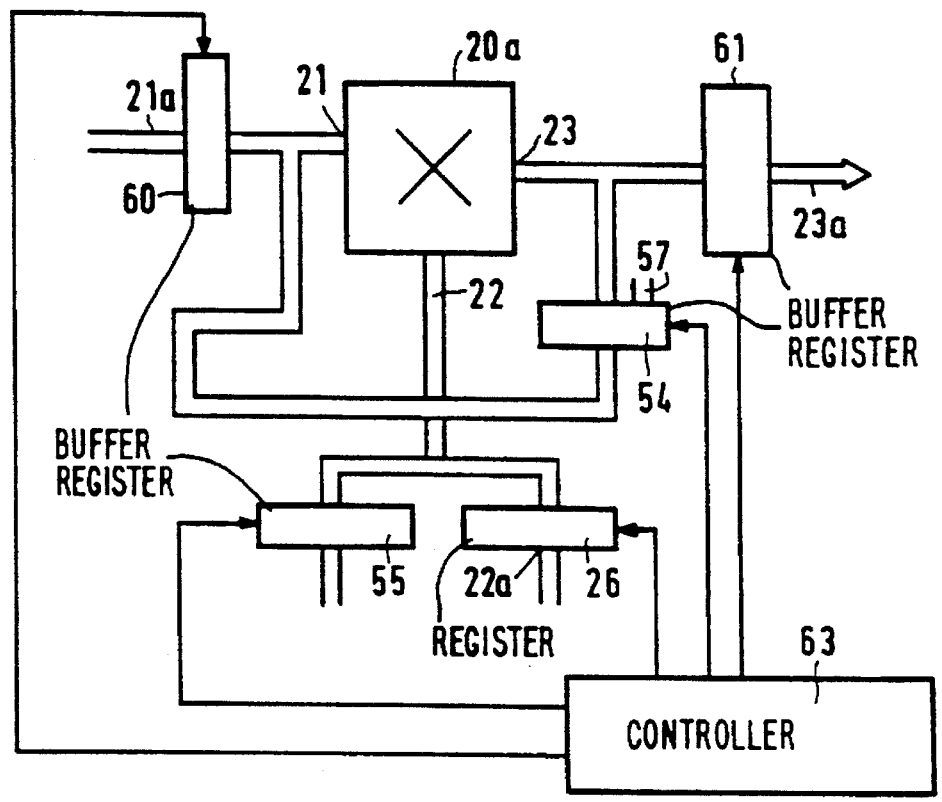
FIGS. 6 and 7 show modifications of the circuit according to the invention.

FIG. 6 shows an embodiment for the signal strength adapter circuit in which this is realized. Herein the elements corresponding to those of FIGS. 2 and 5 are referenced by like reference characters. The signal adapter in the embodiment shown in FIG. 6 is formed by a multiplier referenced 20a. The signal whose strength is to be adapted is not directly applied to the input 21 of the multiplier 20a, but is applied to the input 21a of a buffer register 60, the output of which register is connected to the input 21. The signal whose strength has been adapted is not tapped from the output 23 but from the output 23a of a buffer register 61 whose input is coupled to the output 23 of the multiplier 20a. Besides register 26, also the buffer register 55 is connected to the input 22 of the multiplier 20a. The output of the buffer register 54 is coupled to the input 22 of the multiplier 20a. The input of the buffer register 54 is coupled to the output 23. The registers 60 and 54 may be controlled in a customary fashion by a controller 63, so that in first time intervals Ta, the buffer 60 has access to the input 21 of the multiplier 20a, and in second time intervals Tf, the register 54 has access to the input 21. Similarly, the registers 26 and 55 may be controlled by the controller 63, so that in the first time intervals Ta, the buffer 26 has access to the input 22 of the multiplier 20a, and in second time intervals Tf, the register 55 has access to the input 22. In this manner there is achieved that in the time intervals Ta, always a sample of the adapted signal on output 23 of multiplier 20a becomes available. This adapted sample is loaded into the buffer register 61 under the control of the controller 63, so that the signal whose strength has been adapted can be tapped from the output 23a of the buffer 61. In time intervals Tf there is always a next strength value available on the output of the multiplier 20a. This strength value is loaded into the buffer register 54 under the control of the controller.

Obviously, the multiplier 20a may also be substituted by a multiplier which was already available anyhow for performing multiplications for other signal processes. For example, a digital signal processor often comprises the necessary digital filters in which also a number of multiplications are to be performed. The multiplier used for performing the filter operation may also be used for adapting the signal strength and generating the function values.

With signal strengths set to a low value, only a relatively small number of the available bits of the samples having adapted signal strength on the output of the signal adapter are used for representing the sample value. This means that the influence of quantization noise becomes noticeable with a low value of the set signal strength.

Figure 7:
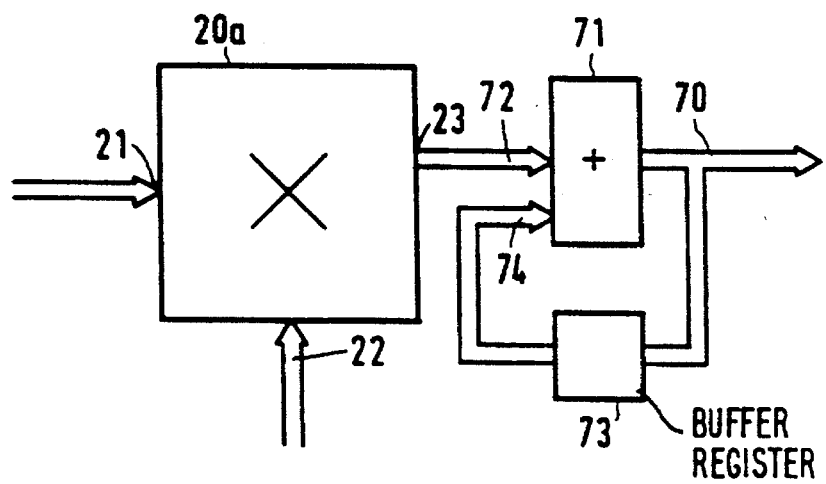

FIG. 7 shows an embodiment for the multiplier in which the influence of quantization noise is strongly reduced. The signal samples applied to input 21 have an n-bit word length. A customary value for n is twenty. The multiplier 20a is of a type representing the result of the multiplier in words m bits in length, with m greater than n. A practical value for m is, for example, thirty-eight. From these m-bits the n most significant bits are used for the signal value of the sample having adapted signal strength. These n most significant bits are fed to a bus 70. Between the output 23 of the multiplier and the bus 70 an adder 71 is inserted of which a first input 72 is coupled to the output 23 of the multiplier 20a. The n most significant bits on the output of the adder 71 are fed to the bus 70. The m-n least significant bits on the output of the adder 71 are applied to a second input 74 of the adder 71 via a buffer register 73. In this manner there is achieved that the value represented by the m-n least significant bits is always added to the result of the next multiplication. The quantization method (truncation) described hereinbefore, in which the residual error is added to a value to be quantized next, is known as first-order noise shaping.

By implementing noise shaping, the desired signal is approximated in a simple but highly accurate manner. This is contrary to methods in which the result of the multiplication is rounded off or truncated.

The first-order noise shaping used here is advantageous in that the signal contains few higher harmonics, so that a sinusoidal audio signal with a very low signal strength is still perceived as a sinusoidal signal by a listener. Due to the noise shaping the noise level at higher frequencies increases. Therefore, this noise shaping is preferably used in combination with an increase of the sample rate (upsampling) or in combination with large word sizes.

In the latter case the quantization noise lies at a very low level.

Finally, it is noted that it is alternatively possible, in principle, to use a higher order noise shaping in lieu of a first-order noise shaping. However, this produces only a minor improvement with respect to the suppression of the higher harmonics, whereas the type of circuit required is considerably more complex.

We claim:

1. Signal strength adapter circuit for smoothly changing a signal strength of an input signal starting with an initial signal strength and ending with a final signal strength, the signal strength adapter circuit comprising:

a signal adapter having a signal input for receiving the input signal, a digital set input for receiving a strength value, and a signal output for presenting an adapted signal that has a strength corresponding to the strength value on the digital set input; and control means for generating, at successive discrete instants, a series of strength values which fix a function changing with time, said control means comprising means for applying the generated strength values to the digital set input, wherein the control means comprises:

function generator means for periodically generating a next function value of a series of successive function values which determine, in coarse steps, a function which changes substantially exponentially with time; and adapter means for adapting the strength value in fine steps in accordance with a predetermined variation starting with a function value that has just been given and ending with a function value that is given next, characterized in that the input signal at the signal input of the signal adapter is presented as a series of successive signal values in synchronism with a specific clock signal, while the fine steps correspond to the least significant bit in the strength value, said signal strength adapter circuit further comprising means for terminating the adapting of the strength value by the adapter means once the strength value has reached the generated next function value.

2. Signal strength adapter circuit as claimed in claim 1, characterized in that the signal adapter comprises a digital multiplier for deriving the adapted signal on the signal output by multiplying the input signal on the signal input by the strength value on the digital set input.

3. Signal strength adapter circuit as claimed in claim 2, characterized in that the function generator means comprises further control means for causing the digital multiplier to perform an iterated multiplication in which a result of a previous multiplication is multiplied, each time, by a constant value and successive results obtained from the digital multiplier represent the successive function values.

4. Signal strength adapter circuit as claimed in claim 3, characterized in that the digital multiplier generates an m-bit signal value, and the signal strength adapter circuit further comprises noise shaping means for achieving an accurate handling of the signal processed by the digital multiplier, said noise shaping means comprising quantizing means for presenting n most significant bits of the m-bit signal value on the signal output, and adder means for adding the m-n least significant bits of the m-bit signal value to a next m-bit signal value to be generated by the digital multiplier.

5. Signal strength adapter circuit as claimed in claim 2, characterized in that the digital multiplier generates an m-bit signal value, and the signal strength adapter circuit further comprises noise shaping means for achieving an accurate handling of the signal processed by the digital multiplier, said noise shaping means comprising quantizing means for presenting n most significant bits of the m-bit signal value on the signal output, and adder means for adding the m-n least significant bits of the m-bit signal value to a next m-bit signal value to be generated by the digital multiplier.

6. Signal strength adapter circuit for smoothly changing a signal strength of an input signal starting with an initial signal strength and ending with a final signal strength, the signal strength adapter circuit comprising:

a signal adapter having a signal input for receiving the input signal, a digital set input for receiving a strength value, and a signal output for presenting an adapted signal that has a strength corresponding to the strength value on the digital set input; and control means for generating, at successive discrete instants, a series of strength values which fix a function changing with time, said control means comprising means for applying the generated strength values to the digital set input, wherein the control means comprises:

function generator means for periodically generating a next function value of a series of successive function values which determine, in coarse steps, a function which changes substantially exponentially with time; and adapter means for adapting the strength value in fine steps in accordance with a predetermined variation starting with a function value that has just been given and ending with a function value that is given next, characterized in that the signal adapter comprises a digital multiplier for deriving the adapted signal on the signal output by multiplying the input signal on the signal input by the strength value on the digital set input.

7. Signal strength adapter circuit as claimed in claim 6, characterized in that the function generator means comprises further control means for causing the digital multiplier to perform an iterated multiplication in which a result of a previous multiplication is multiplied, each time, by a constant value and successive results obtained from the digital multiplier represent the successive function values.

8. Signal strength adapter circuit as claimed in claim 7, characterized in that the digital multiplier generates an m-bit signal value, and the signal strength adapter circuit further comprises noise shaping means for achieving an accurate handling of the signal processed by the digital multiplier, said noise shaping means comprising quantizing means for presenting n most significant bits of the m-bit signal value on the signal output, and adder means for adding the m-n least significant bits of the m-bit signal value to a next m-bit signal value to be generated by the digital multiplier.

9. Signal strength adapter circuit as claimed in claim 6, characterized in that the digital multiplier generates an m-bit signal value, and the signal strength adapter circuit further comprises noise shaping means for achieving an accurate handling of the signal processed by the digital multiplier, said noise shaping means comprising quantizing means for presenting n most significant bits of the m-bit signal value on the signal output, and adder means for adding the m-n least significant bits of the m-bit signal value to a next m-bit signal value to be generated by the digital multiplier.

10. Signal strength adapter circuit for smoothly changing a signal strength starting with an initial signal strength and ending with a final signal strength, the signal strength adapter circuit comprising:

a signal adapter having a signal input for receiving the signal, a digital set input for receiving a strength value, and a signal output for presenting an adapted signal that has a strength corresponding to the strength value on the digital set input; and control means for generating, at successive discrete instants, a series of strength values which fix a function changing with time, said control means comprising means for applying the generated strength values to the digital set input, characterized in that the control means comprises:

a function generator for periodically generating a next function value of a series of function values, said function generator comprising a digital multiplier for multiplying a function value with a predetermined constant factor so as to generate a next function value, and that the digital multiplier also forms part of the signal adapter so as to multiply subsequent signals with subsequent strength values derived from said next function value.

11. Signal strength adapter circuit for smoothly changing a signal strength of an input signal starting with an initial signal strength and ending with a final signal strength, the signal strength adapter circuit comprising:

a signal adapter having a signal input for receiving the input signal, a digital set input for receiving a strength value, and a signal output for presenting an adapted signal that has a strength corresponding to the strength value on the digital set input; and control means for generating, at successive discrete instants, a series of strength values which fix a function changing with time, said control means comprising means for applying the generated strength values to the digital set input, characterized in that the control means comprises:

function generator means for periodically generating a next function value of a series of successive function values which determine, in coarse steps, a function which changes substantially exponentially with time; and adapter means for adapting the strength value in fine steps in accordance with a predetermined variation starting with a function value that has just been given and ending with a function value that is given next, said predetermined variation being linear.

* * * * *